United States Patent [19]

Shirato

[11] Patent Number: 4,602,267
[45] Date of Patent: Jul. 22, 1986

[54] PROTECTION ELEMENT FOR SEMICONDUCTOR DEVICE

[75] Inventor: Takehide Shirato, Hiratsuka, Japan

[73] Assignee: Fujitsu Limited, Kawasaki, Japan

[21] Appl. No.: 346,224

[22] Filed: Feb. 5, 1982

[30] Foreign Application Priority Data

Feb. 17, 1981 [JP] Japan .................. 56-22008
Aug. 31, 1981 [JP] Japan ................. 56-136663

[51] Int. Cl.⁴ .................. H01L 29/72; H01L 29/90; H01L 27/04
[52] U.S. Cl. .................... 357/35; 357/13; 357/23.13; 357/41; 357/43
[58] Field of Search .............. 357/23.13, 34, 42, 35, 357/13, 43, 41

[56] References Cited

U.S. PATENT DOCUMENTS

| 3,403,270 | 9/1968 | Pace et al. | 357/236 P |
| 3,470,390 | 9/1969 | Lin | 357/23.13 |
| 3,577,043 | 5/1971 | Cook | 357/41 |
| 3,739,238 | 6/1973 | Hara | 357/236 P |
| 4,131,908 | 12/1978 | Daub et al. | 357/42 |
| 4,139,935 | 2/1979 | Bertin et al. | 357/13 |
| 4,256,515 | 3/1981 | Miles et al. | 357/43 |

FOREIGN PATENT DOCUMENTS 56-83964 7/1981 Japan .

Primary Examiner—Martin H. Edlow
Assistant Examiner—E. Fallick
Attorney, Agent, or Firm—Staas & Halsey

[57] ABSTRACT

A protection element responsible for protecting a semiconductor element included in a semiconductor device from a voltage higher than the voltage which the semiconductor element is allowed to receive, the protection element virtually being a lateral bipolar transistor, in which an improvement is made to increase the voltage at which the protection element operates. The improvement being realized by separating the emitter from a region containing an impurity at a high concentration and which is a portion of the base of the lateral bipolar transistor.

5 Claims, 10 Drawing Figures

PROTECTION ELEMENT FOR SEMICONDUCTOR DEVICE

BACKGROUND OF THE INVENTION

The present invention relates to a protection element responsible for the protection of an ordinary semiconductor element included in a semiconductor device from a voltage higher than the normal voltage which the ordinary semiconductor element is allowed to receive. More specifically, this invention relates to an improvement applicable to a structure of an element which has the purpose of protecting an ordinary semiconductor element included in an integrated circuit from having applied thereto a voltage higher than expected.

The magnitude of an electric voltage allowed to be applied to an integrated circuit is rather limited, because the geometrical dimensions of an integrated circuit are fairly small. It is therefore preferable that each ordinary semiconductor element included in an integrated circuit be associated with a specific element which is responsible for discharging an unexpectedly high voltage to ground, whenever such a high voltage is applied to the ordinary semiconductor element included in the integrated circuit, for the ultimate purpose of protecting the ordinary semiconductor element from being destroyed by such a high voltage. In reality, each integrated circuit contains a group of protection elements having the foregoing function. Since ordinary semiconductor elements of an integrated circuit are designed to work with a relatively low voltage, e.g. 5 V, the working voltage of such protection elements is ordinarily selected to be in the range of 6 to 7 V. However, some discrete elements such as fluorescent type display elements operate in a voltage range of 40 through 50 V and are connected with some of the ordinary semiconductor elements included in an integrated circuit. This requires a protection element which has a working voltage which exceeds the aforementioned voltage range of the protection elements available in the prior art, e.g. 6 to 7 V.

This simplest structure of such a protection element as described above is a p-n junction applied with a reverse bias, which breaks down under the condition that the associated or protected ordinary semiconductor element has applied thereto a voltage higher than the allowable voltage.

An improved structure for such a protection element as described above is a type of parasitic MOS field effect transistor in which the gate and drain are connected to a protected element and the source is grounded. The parasitic MOS field effect transistor is designed to become conductive exclusively under the condition that the drain has applied thereto a voltage identical to or higher than the threshold voltage of the protection element. Therefore, the threshold voltage of the protection element is required to be slightly more than the working voltage of the protected element. Thus, the impurity concentration of the channel stopper region must be relatively high. However, a high impurity concentration has a drawback which results in a lower breakdown voltage between the drain region and the channel stopper region, making it difficult to produce a protection element of the parasitic MOS field effect transistor type having a high working voltage.

Another improved structure for such a protection element as described above is a lateral bipolar transistor in which the emitter is connected to a protected element and in which the base and collector are grounded. The lateral bipolar transistor is designed to become conductive exclusively under the condition that the emitter has applied thereto a voltage identical to or higher than the threshold voltage of the lateral bipolar transistor serving as a protection element. In other words, a p-n junction between the emitter region and the substrate or between the emitter region and the base region which actually is the channel stopper region is broken down when a voltage identical to or higher than the working voltage of the protection element is applied to the emitter. This charges up the substrate. As soon as the potential of the substrate exceeds the potential of the collector, the lateral bipolar transistor becomes conductive and functions as a protection element. Accordingly, the working voltage of the lateral bipolar transistor type protection element is actually determined by the breakdown voltage between the emitter region and the substrate or by the breakdown voltage between the emitter region and the base region which actually is the channel stopper region. However, since the essential object of the channel stopper is to prevent the parasitic transistor function from occurring for the entire area of an integrated circuit, the amount of impurity concentration is rather limited for the channel stopper region, making it difficult to produce a protection element of a lateral bipolar transistor type having a high working voltage. In reality, even if the amount of the impurity dose is selected to be as low as $10^{13}/cm^2$, it is difficult to make the working voltage of such a protection element higher than 30 V.

Accordingly, any structure of the protection elements available in the prior art is not satisfactory for production of a protection element having a working voltage of 40 V or higher.

SUMMARY OF THE INVENTION

An object of the present invention is to provide an element responsible for protection of an ordinary semiconductor element included in a semiconductor device from a voltage higher than the voltage which is allowed for the ordinary semiconductor element, wherein the improvement is made to increase the working voltage thereof or to increase the voltage at which the protection element is expected to operate.

To attain the foregoing object, a protection element in accordance with the present invention is a type of a lateral bipolar transistor which is provided with (a) a first region having one conductivity, of which the top surface is substantially covered by an insulating layer, (b) a second region having a conductivity different from that of the first region and which is produced in a selected top portion of the first region, (c) a third region having a conductivity different from that of the first region and which is produced in a selected top portion of the first region, (d) a fourth region separating the foregoing second region and the foregoing third region and which is covered by the foregoing insulating layer, the fourth region having the same conductivity type as the first region with a higher impurity concentration than that of the first region, and the fourth region contacting with the foregoing third region but being separated from the foregoing second region, (e) a first electrode connecting a protected element with the foregoing second region, and (f) a second electrode arranged on the foregoing third region and which is grounded.

The improvement realized in the present invention is that the second region (the emitter) of the lateral bipolar transistor is separated from the fourth region, resulting in an increase in the breakdown voltage between the emitter and the base up to a level determined by the amount of specific resistance of the first region. This is due to the fact that the depletion layer extends considerably when the potential of the second region (the emitter) is increased, further increasing the working voltage of a protection element in accordance with the present invention up to a satisfactory level of 40 to 50 V or higher. Experimental results successfully determine that the working voltage of a protection element in accordance with the present invention (the voltage at which an ordinary element is safely protected by a protection element in accordance with the present invention) is increased to 50 V or higher when the distance between the second region and the fourth region is 3 micrometers.

BRIEF DESCRIPTION OF THE DRAWINGS

The present invention, together with its various features and advantages, can be readily understood from the following more detailed description presented in conjunction with the following drawings, in which.

DESCRIPTION OF THE PREFERRED EMBODIMENTS

Figure 1:
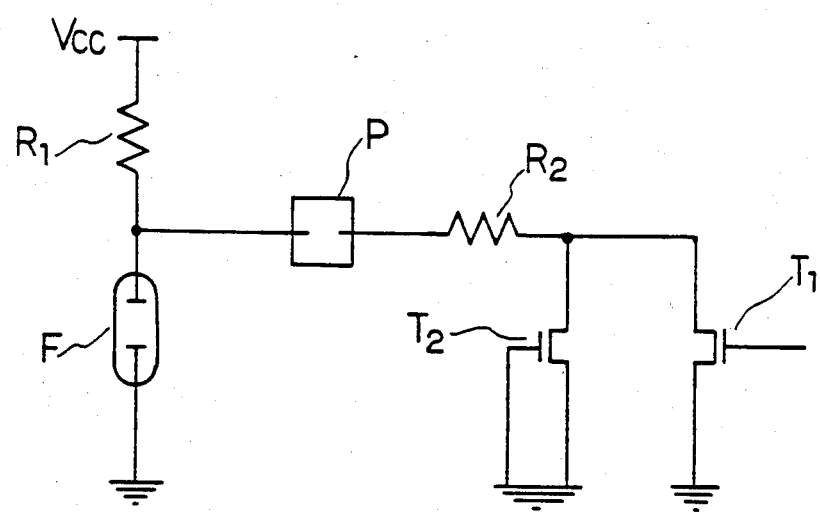
FIG. 1 is a connection diagram of a protection element in accordance with one embodiment of the present invention in use for protection of an associated or protected ordinary semiconductor element which is connected with a fluorescent tube type display element which is operative with a voltage of approximately 40 V and which is employed as a discrete element.

Referring to FIG. 1, a transistor indicated as $T_1$ is a transistor operative with a voltage of e.g. 40 V, and this transistor $T_1$ is protected by a protection element $T_2$ in accordance with one embodiment of the present invention from receiving too high a voltage, e.g. 45 V, which may be accidentally applied by a power supply $V_{cc}$ which is the power supply for a fluorescent tube type display element F operative with a voltage of e.g. 40 V. The elements indicated as $R_1$ and $R_2$ are resistors and the element indicated as P is an input/output pad connecting elements contained in an integrated circuit and discrete elements, in this case the fluorescent tube type display element F and the discrete resistor $R_1$. The input/output pad P is connected to one or more input terminals (not shown) of one or more input circuits (not shown) each of which is made up of one or more ordinary transistors operative with a voltage of e.g. 5 V. One or more ordinary transistors are included in the integrated circuit device in question.

Figure 2:
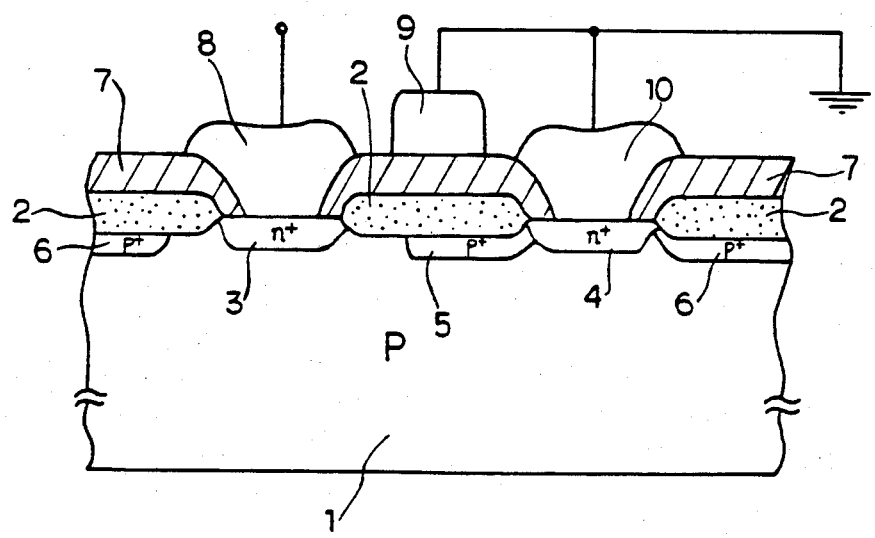
FIG. 2 is a cross-sectional view of a portion of a wafer containing a protection element in accordance with one embodiment of the present invention.

Referring to FIG. 2, the region indicated as 1 is a first region of a p-type silicon (Si) substrate of which the top surface is mostly covered by a silicon dioxide ($SiO_2$) insulating layer 2. Two n+-type regions (a second region 3 and a third region 4) are arranged in selected top portions of the Si substrate 1, which selected portions are not covered by the $SiO_2$ insulating layer. Under the usual conventions for labelling transistor regions, the emitter of an npn transistor is expected to be forward biased with respect to the base. Therefore, the second region 3 and third region 4 would be respectively considered collector and emitter, if the input voltage is positive, and emitter and collector, if the input voltage is negative. However, to conform to the description of the protection device in the Background of the Invention, these two regions 3 and 4 will be respectively termed as the emitter and the collector of a lateral bipolar transistor which comprises a protection element in accordance with one embodiment of the present invention without regard to the polarity of the input voltage.

The two regions 3 and 4 are separated by a portion of the first region 1 which portion is covered by the $SiO_2$ insulating layer 2. In the first region 1, a fourth region of a p+-type region 5 is arranged under the surface of the $SiO_2$ insulating layer 2. It is important that the fourth region 5 does not completely bridge the interval between the second region 3 and the third region 4. In other words, the fourth region 5 contacts with the third region 4, but the fourth region 5 is separated from the second region 3. The substrate 1 functions as a base of the lateral bipolar transistor which comprises a protection element in accordance with one embodiment of the present invention. Since a space is left between the second region (the emitter) 3 and the fourth region 5, the breakdown voltage of the second region (the emitter) 3 against the substrate 1 is increased to the level determined by the specific resistance of the substrate 1. The fourth region 5 has a function of preventing the punch-through phenomenon from occurring in the region between the second region 3 and the third region 4. However, if the fourth region 5 contacts the second region 3, resultantly bridging the second region 3 and the third region 4, the working voltage of the protection element turns out to be decided following the breakdown voltage between the fourth region 5 and the second region 3. This means that the working voltage of the protection element is selected to be an unexpectedly low voltage, causing an undesirable performance. This is the reason why the fourth region 5 should be separated from the second region 3. The p+-type regions 6 are channel stoppers and are arranged beneath the $SiO_2$ insulating layer 2 functioning as a field insulating layer. The region indicated as 7 is a phosphosilicate glass (PSG) film covering the $SiO_2$ insulating layer 2, and having windows on the second region 3 and the third region 4. The regions indicated as 8, 9 and 10 are respectively a first electrode 8 which connects the second region 3 with a protected element (not shown), an additional electrode 9 which is grounded and a second electrode 10 which grounds the third region 4. In the foregoing construction, the additional electrode 9 is not positively involved with the protection activity for a protection element in accordance with the present invention. The major purpose of the additional electrode 9 is to enable a protection element in accordance with the present invention to be produced employing the same process as for production of the other active or passive elements which, in combination with the protection element, are produced in an integrated circuit device. As described above, the additional electrode 9 is arranged on the phosphosilicate glass (PSG) 7. This protects the protection element from the external contamination caused by sodium ions (Na+) or the like.

Accordingly, a type of lateral bipolar transistor having the foregoing structure is allowed to function as an element responsible for protection of an associated ordinary element contained in an integrated circuit and the protection element has a working voltage higher than any of such protection elements available in the prior art.

Figure 3:
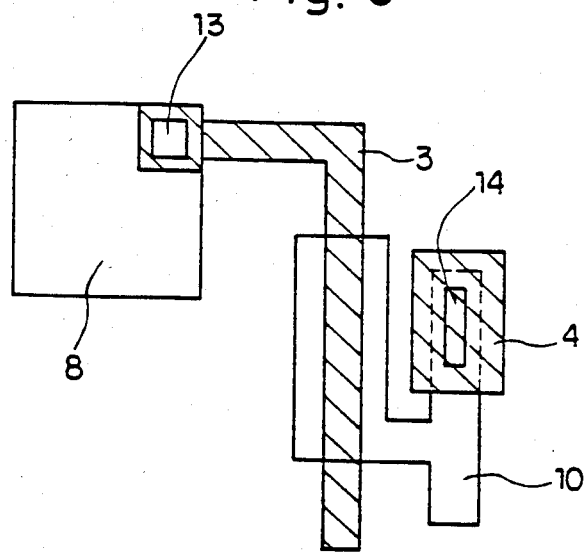
FIG. 3 is a plan view of a portion of a wafer containing a protection element in accordance with one embodiment of the present invention.

Referring to FIG. 3, the areas indicated as 13 and 14 are respectively an area connecting the second region 3 and the first electrode 8 and an area connecting the third region 4 and the second electrode 10.

Figure 4:
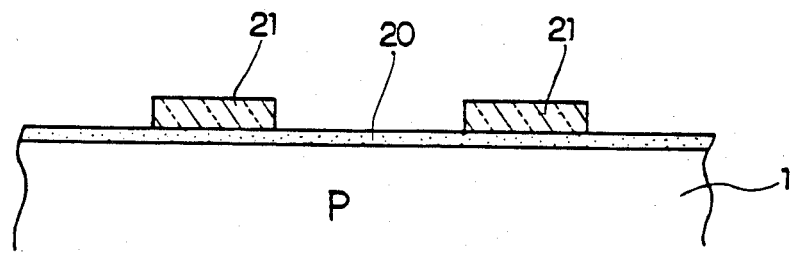
FIG. 4 is a cross-sectional view of a wafer for production of a protection element in accordance with one embodiment of the present invention showing the position after completion of a process for production of a mask employed for implantation of ions in a substrate for production of various regions containing impurities identical to that of the substrate.

Referring to FIG. 4, a silicon nitride ($Si_3N_4$) film 21 having a thickness of approximately 1,000 angstroms is produced on selected areas of a $SiO_2$ film 20 having the thickness of approximately 500 angstroms produced on the top surface of the p-type Si substrate 1 having a specific resistance of 20 ohm-centimeters. The $Si_3N_4$ film 21 covers the $SiO_2$ film 20 except for the area corresponding to the fourth region 5 and the channel stoppers 6, and is employed as a mask for implantation of ions in the foregoing regions 5 and 6 shown in FIG. 2.

Figure 5:
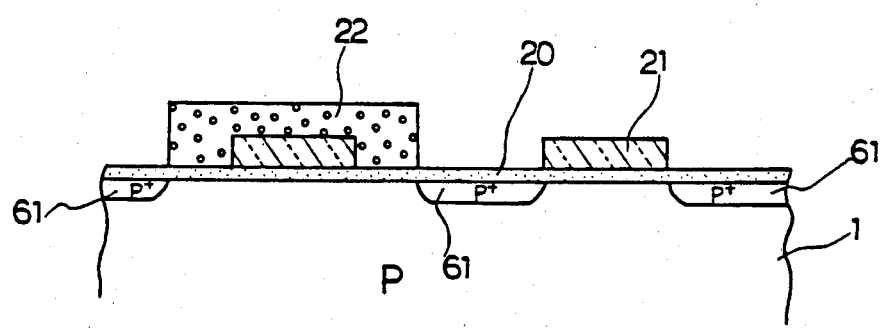
FIG. 5 is a cross-sectional view of a wafer for production of a protection element in accordance with one embodiment of the present invention showing the position after completion of a process of ion implantation for production of various regions containing impurities identical to that of the substrate excepting the area adjacent to the second region.

Referring to FIG. 5, a photoresist film 22 is produced to cover the area corresponding to the second region 3 and the area adjacent thereto, before boron (B) ions are implanted employing an implantation energy of 60 KeV at a dose of $1 \times 10^{13}/cm^2$ for production of p+-type regions 61 which are the fourth region 5 and the channel stoppers 6 shown in FIG. 2.

Figure 6:
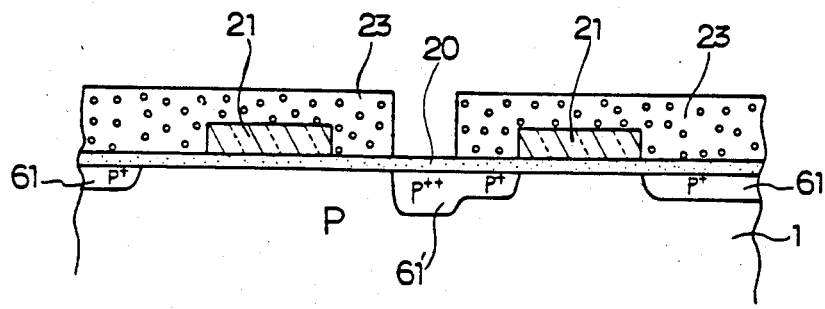
FIG. 6 is a cross-sectional view of a wafer for production of a protection element in accordance with one embodiment of the present invention showing the position after completion of a process of ion implantation for production of portions of various regions containing impurities identical to that of the substrate at a higher concentration.

Referring to FIG. 6, a photoprocess is employed for production of another photoresist film 23 covering the top surface of the substrate 1 except for the areas corresponding to the regions in which boron (B) ions are scheduled to be introduced at a higher concentration, before an ion implantation process is applied employing the implantation energy of 60 KeV and a dose of $4 \times 10^{13}/cm^2$ for production of p++-type regions 61'. The reason why these p++-type regions 61' are preferred is to cause high voltage elements which are inevitably contained in the type of integrated circuit in question, to refrain from performing the so-called parasitic transistor function.

Figure 7:
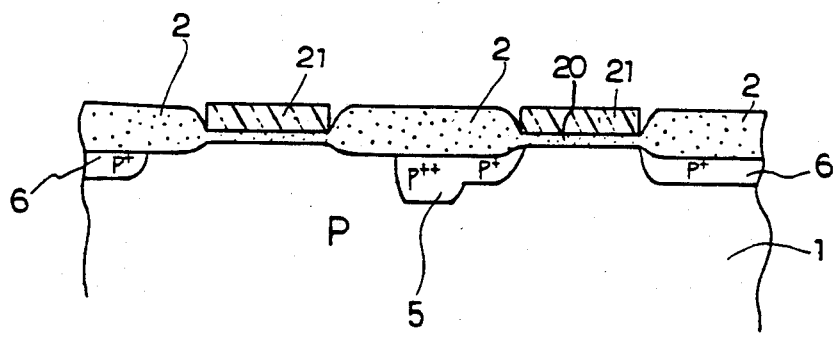
FIG. 7 is a cross-sectional view of a wafer for production of a protection element in accordance with one embodiment of the present invention showing the position after completion of a process for production of a field insulating layer.

Referring to FIG. 7, the photoresist film 23 is removed, before a selective oxidization process employing wet oxygen is applied to the wafer for production of the $SiO_2$ insulating film 2 having a thickness of 6,000 to 8,000 angstroms. The ultimate thickness and the impurity concentration of the p++-type regions 61' are respectively 0.75 micrometers and $10^{17}/cm^3$. The corresponding figures for the p+-type regions 61 are respectively 0.6 micrometers and $10^{16}/cm^3$. FIG. 7 illustrates that as to the areas depicted in FIG. 2, no impurities were introduced into the area surrounding the second region 3 and the fourth region 5 and the channel stoppers 6 were produced.

Figure 8:
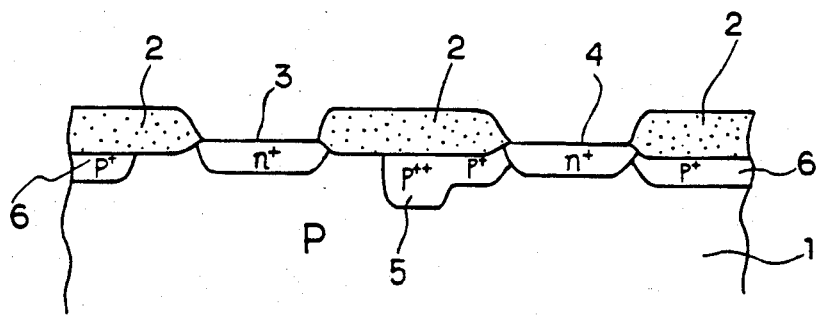
FIG. 8 is a cross-sectional view of a wafer for production of a protection element in accordance with one embodiment of the present invention showing the position after completion of a process for production of the second and third regions.

Referring to FIG. 8, arsenic (As) ions are implanted for production of the n+-type second region 3 and the n+-type third region 4. The ion implantation energy employed is 120 KeV and the ion implantation is carried out until the dose reaches $4 \times 10^{15}/cm^2$. The other n+-type regions are simultaneously produced for the other elements contained in the same integrated circuit. The ultimate thickness and the impurity concentration, realized by annealing, of the n+-type regions 3 and 4 are respectively 0.4 micrometers and $10^{20}/cm^3$. The following steps are quite similar to those for production of the MOS field effect transistors. The p++-type region 61' is not necessarily essential for the foregoing protection element in accordance with the present invention. However, in a case where the impurity concentration of the p-type Si substrate 1 is marginal and a tendency for the leakage current to readily flow therein is observed, the p++-type region 61' is effective to decrease the amount of the leakage current.

Since reduction in the geometrical dimension is one of the most fundamental requirements for an integrated circuit, the length of the fourth region 5 is required to be as short as possible. Although the length of the fourth region 5 is primarily limited by the accuracy in positioning of masks, etc., the experimental results indicate the dimension can be as small as 7 micrometers, leaving an interval of 3 micrometers between the ends of the n+-type second region and the p+-type or p++-type fourth region. A protection element having this dimension is determined to have a working voltage of 50 V and is employable for protection of an ordinary element which operates with a voltage of 40 V or slightly higher.

It is to be emphasized that the present invention is particularly efficient for application to an n-channel element, since it is difficult to produce an n-channel element which is suitable for a high voltage.

Figure 9:
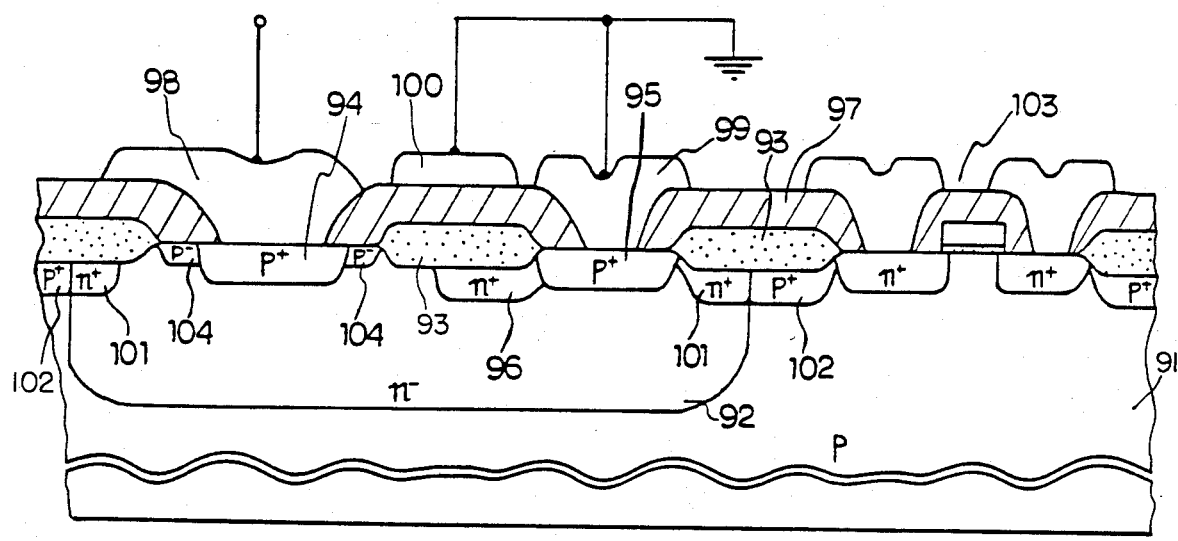
FIG. 9 is a cross-sectional view of a portion of wafer containing a protection element in accordance with another embodiment of the present invention.

The foregoing description directed to an embodiment in which the first region is the p-type semiconductor substrate, should not be interpreted in a limiting sense. In other words, many other embodiments or modifications are possible in accordance with the present invention. For example, a second embodiment, as illustrated in FIG. 9, is a protection element produced in a p-type well region selectively produced in an n-type semiconductor substrate which is connected to a reference voltage, e.g. the ground voltage. This type protection element having a p-type well region functions predominantly as a vertical bipolar transistor in which the second region is the emitter, the first region or the p-type well region is the base and the semiconductor substrate is the collector, when the protection element is expected to work against a relatively small electric current. On the other hand, the same protection element functions predominantly as a lateral bipolar transistor as described above, when the protection element is expected to work against a relatively large electric current.

Referring to FIG. 9 illustrating the protection element in accordance with the second embodiment of the present invention, referred to above, the region indicated as 91 is a p-type Si substrate having the specific resistance of 20 ohm-centimeters, and the region indicated as 92 is an $n^-$-type well region having the impurity concentration of $10^{16}/cm^3$ and a specific resistance of 0.5 to 1.0 ohm-centimeters and which is selectively produced to a depth of 5 micrometers in the Si substrate 91. The region indicated as 93 is an insulating layer of silicon dioxide ($SiO_2$) selectively produced on top of the Si substrate 91 and the $n^-$-type well region 92. The regions indicated as 94 and 95 are $p^+$-type regions having a thickness and an impurity concentration respectively of 0.6 micrometers and $10^{20}/cm^3$ and which are separated by the insulating layer 93. The region indicated as 96 is an $n^+$-type region having a thickness and an impurity concentration respectively of 0.6 micrometers and $10^{17}/cm^3$ and which is produced along the bottom of the insulating layer 93 to contact with the $p^+$-type region 95 but being separated from the $p^+$-type region 94. The region indicated as 97 is a phosphosilicate glass (PSG) layer produced on top of the insulating layer 93. The region indicated as 98 is a first electrode which connects the $p^+$-type region 94 and an ordinary semiconductor element (not shown) protected by this protection element. The region indicated as 99 is a second electrode which grounds the $p^+$-type region 95. The region indicated as 100 is an additional electrode produced on top of the phosphosilicate glass (PSG) layer 97. The regions indicated as 101 and 102 are respectively an $n^+$-type channel stopper having a thickness and an impurity concentration respectively of 0.6 micrometers and $10^{17}/cm^3$ and a $p^+$-type channel stopper having a thickness and an impurity concentration respectively of 0.6 micrometers and $10^{17}/cm^3$. The region indicated as 103 is an n-channel type MOS field effect transistor element produced in the p-type silicon substrate 91.

The $n^-$-type well region 92 performs a function corresponding to that of the first region described in the first embodiment which is one of the essential elements of a protection element in accordance with the present invention. Further, the $p^+$-type region 95 and the $n^+$-type region 96 respectively act as elements corresponding to the third region and the fourth region defined for a protection element in accordance with the present invention.

The impurity concentration of the $n^-$-type well region 92 in which the protection element is produced, is selected to be higher than that of the p-type semiconductor substrate 91. Therefore, the specific resistance of the $n^-$-type well region 92 becomes less than that of the p-type semiconductor substrate 91. Specifically, the specific resistance of the $n^-$-type well region 92 is selected to be 0.5 to 1 ohm-centimeters, as described above. Therefore, the extension of depletion layers extending from the $p^+$-type regions 94 and 95 into the $n^-$-type well region 92 becomes rather small, causing a relatively small magnitude of breakdown voltage between the $p^+$-type regions 94 and 95 and then $n^-$-type well region 92.

To remove this drawback, a protection element in accordance with this embodiment is provided with a $p^-$-type region 104 which constitutes a fifth region having a thickness and an impurity concentration respectively of 0.3 micrometers and $10^{16}/cm^3$. The fifth region is produced on top of the $n^-$-type well region 92 which corresponds to the first region and surrounds the $p^+$-type region 94 which is the second region defined as an essential element of a protection element of the present invention. A space remains between the $p^-$-type region 104 and the $n^+$-type region 96 which is defined as an essential element of a protection element of the present invention.

The arrangement of the $p^-$-type region 104 surrounding the $p^+$-type region 94 is effective to increase the extension of the depletion layers extending from the p-type region comprising the $p^+$-type region 94 and the $p^-$-type region 104, into the $n^-$-type well region 92. Further, this is effective to decrease the magnitude of the intensity of the electric field around the circular area where the $p^+$-type region 94 and the top portion of the $n^-$-type well region 92 contact each other.

As a result, a considerable increase is realized in the breakdown voltage between the p-type regions 94 and 104 and the $n^-$-type well region 92, thereby increasing the working voltage of the protection element provided with a $p^-$-type region 104. A proper selection of conductivity, impurity concentration and depth for $p^-$-type region 104 enables production of a protection element having a working voltage of approximately 40 V.

Figure 10:
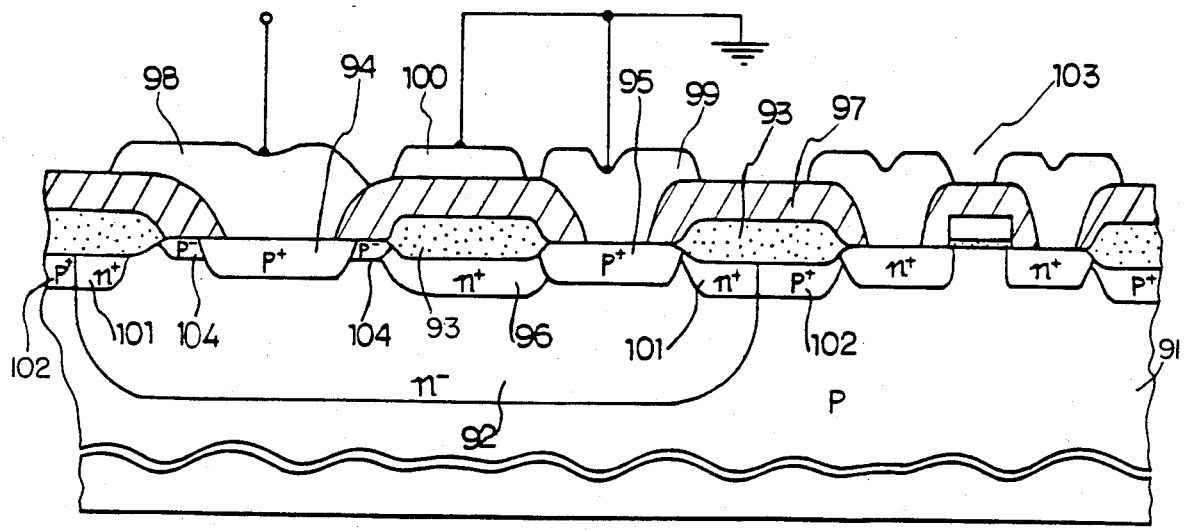
FIG. 10 is a cross-sectional view of a portion of a wafer containing a protection element in accordance with a further embodiment of the present invention.

The foregoing embodiment of the present invention can be modified to produce a further embodiment of the present invention illustrated in FIG. 10 for the case in which the working voltage is slightly less than that for the immediately previous embodiment, e.g. approximately 30 V.

Referring to FIG. 10 in which the same numerals are given to the corresponding regions appearing in FIG. 9, the $n^+$-type region 96 is arranged to contact with the $p^-$-type region 104 for the purpose of decreasing the working voltage of the protection element. Because the breakdown voltage of the p-n junction appearing between the $p^-$-type region 104 and the $n^+$-type region 96 determines the working voltage of the protection voltage, the above described purpose is successfully achieved. Since this configuration excludes a space separating the $n^+$-type region 96 from the $p^-$-type region 104, a higher degree of integration can be readily realized for an integrated circuit device which includes one or more protection elements in accordance with this embodiment. The exclusion of the space separating the $n^+$-type region 96 from the $p^-$-type region 104 is effective to decrease the base width of the lateral bipolar transistor, as a result increasing the current amplification degree ($h_{FE}$), further as a result increasing the capacity for current absorption of this lateral bipolar transistor.

As frequently described above, a protection element in accordance with the present invention can be constructed as a type of lateral bipolar transistor. Therefore, the function of a protection element in accordance with the present invention can be thought of as following the operation of a lateral bipolar transistor.

Although the present invention has been described with reference to specific embodiments, this description is not meant to be construed in a limiting sense. It is therefore contemplated that the appended claims will cover any of the modifications or embodiments that fall within the true scope of the present invention.

What is claimed is:

1. A protection element responsible for protecting a semiconductor element included in a semiconductor device having a semiconductor substrate, said protection element preventing the semiconductor element from receiving voltages higher than a maximum allowed voltage, said protection element comprising:
   power supply means for providing a power supply voltage;
   a first region having a first conductivity type;
   an insulating layer substantially covering said first region;
   a second region having a second conductivity type different from that of said first region, said second region being formed in a first selected top portion of said first region;
   a third region having the second conductivity type, said third region being formed in a second selected top portion of said first region;
   a fourth region disposed between said second region and said third region, said fourth region being covered by said insulating layer, said fourth region being of the first conductivity type at a higher impurity concentration than that of said first region, said fourth region being separated from said second region, and said fourth region preventing punch-through between said second and third regions;
   a first electrode connected to the semiconductor element and to said second region; and
   a second electrode in contact with said third region, connected to receive the power supply voltage from said power supply means, the power supply voltage being such that a current flows between said second and third regions by a bipolar transistor action with the first region acting as a base when the voltage higher than the maximum allowed voltage are applied to said first electrode, thereby preventing the semiconductor element from receiving the voltages higher than the maximum allowed voltage.

2. A protection element as defined in claim 1, wherein said first region is the semiconductor substrate.

3. A protection element as defined in claim 1, wherein said first region is a well region and the semiconductor substrate has the second conductivity type, said well region being formed in at least one selected portion of the semiconductor substrate.

4. A protection element responsible for protecting a semiconductor element included in a semiconductor device having a semiconductor substrate of a first conductivity type, said protection element preventing the semiconductor element from receiving voltages higher than a maximum allowed voltage, said protection element comprising:
   power supply means for providing a power supply voltage;
   a first region having a second conductivity type different from the first conductivity type, said first region being a well region formed in at least one selected portion of the semiconductor substrate;
   an insulating layer substantially covering said first region;
   a second region having the first conductivity type, said second region being formed in a first selected top portion of said first region;
   a third region having the first conductivity type, said third region being formed in a second selected top portion of said first region;
   a fourth region disposed between said second region and said third region, said fourth region being covered by said insulating layer, said fourth region being of the second conductivity type at a higher impurity concentration than that of said first region, said fourth region being separated from said second region, and said fourth region preventing punch-through between said second and third regions;
   a first electrode connected to the semiconductor element and to said second region;
   a second electrode in contact with said third region and said power supply means; and
   a fifth region surrounding and contacting said second region, said fifth region having the first conductivity type at a lower impurity concentration than that of said second region.

5. A protection element as defined in claim 4, wherein said fifth region is in contact with said fourth region.

* * * * *